United States Patent
Mungekar et al.

(10) Patent No.: US 10,777,394 B2
(45) Date of Patent: Sep. 15, 2020

(54) VIRTUAL SENSOR FOR CHAMBER CLEANING ENDPOINT

(71) Applicant: Applied Materials, Inc., Santa Clara, CA (US)

(72) Inventors: Hemant P. Mungekar, Campbell, CA (US); William Pryor, Georgetown, TX (US); Zhijun Jiang, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 480 days.

(21) Appl. No.: 15/811,322

(22) Filed: Nov. 13, 2017

(65) Prior Publication Data

US 2018/0166260 A1 Jun. 14, 2018

Related U.S. Application Data

(60) Provisional application No. 62/432,055, filed on Dec. 9, 2016.

(51) Int. Cl.
| | |
|---|---|
| *H01J 37/32* | (2006.01) |
| *C23C 16/44* | (2006.01) |
| *G01B 11/06* | (2006.01) |
| *H01L 21/67* | (2006.01) |

(52) U.S. Cl.
CPC .... *H01J 37/32963* (2013.01); *C23C 16/4405* (2013.01); *G01B 11/06* (2013.01); *G01B 11/0683* (2013.01); *H01J 37/32* (2013.01); *H01J 37/32357* (2013.01); *H01J 37/32972* (2013.01); *H01J 37/32981* (2013.01); *H01L 21/67* (2013.01); *H01J 37/32862* (2013.01)

(58) Field of Classification Search
CPC ............ H01J 37/32963; H01J 37/32; H01J 37/32357; H01J 37/32981; H01J 37/32972; H01J 37/32862; H01L 21/67; G01B 11/06; G01B 11/0683; C23C 16/4405
See application file for complete search history.

(56) References Cited

U.S. PATENT DOCUMENTS

| | | | |
|---|---|---|---|
| 5,453,125 A | 9/1995 | Krogh | |
| 6,156,667 A | 12/2000 | Jewett | |
| 6,291,938 B1 | 9/2001 | Jewett et al. | |
| 6,652,710 B2 * | 11/2003 | Cruse | B24B 37/013 156/345.48 |

(Continued)

*Primary Examiner* — Anita K Alanko
(74) *Attorney, Agent, or Firm* — Patterson + Sheridan, LLP

(57) ABSTRACT

Implementations of the present disclosure generally relate to methods for cleaning processing chambers. More specifically, implementations described herein relate to methods for determining processing chamber cleaning endpoints. In some implementations, a "virtual sensor" for detecting a cleaning endpoint is provided. The "virtual sensor" is based on monitoring trends of chamber foreline pressure during cleaning of the chamber, which involves converting solid deposited films on the chamber parts into gaseous byproducts by reaction with etchants like fluorine plasma for example. Validity of the "virtual sensor" has been confirmed by comparing the "virtual sensor" response with infrared-based optical measurements. In another implementation, methods of accounting for foreline pressure differences due to facility design and foreline clogging over time.

20 Claims, 6 Drawing Sheets

(56) References Cited

U.S. PATENT DOCUMENTS

| | | | |
|---|---|---|---|
| 6,888,040 B1 | 5/2005 | Shufflebotham et al. | |
| 7,323,399 B2 * | 1/2008 | Demos | C23C 16/26 |
| | | | 257/E21.242 |
| 8,742,665 B2 | 6/2014 | Lubomirsky et al. | |
| 8,747,762 B2 | 6/2014 | Dickinson et al. | |
| 8,771,538 B2 | 7/2014 | Lubomirsky et al. | |
| 8,880,210 B2 * | 11/2014 | Porthouse | G05D 16/2046 |
| | | | 700/104 |
| 9,230,780 B2 | 1/2016 | Cox et al. | |
| 9,240,308 B2 | 1/2016 | Cox et al. | |
| 9,333,460 B2 | 5/2016 | Radoiu | |
| 9,378,928 B2 | 6/2016 | Zeng et al. | |
| 9,543,124 B2 | 1/2017 | Cox et al. | |
| 9,552,967 B2 | 1/2017 | Cox et al. | |
| 9,589,773 B2 * | 3/2017 | Bhatia | H01J 37/32963 |
| 10,309,013 B2 * | 6/2019 | Iliopoulos | C23C 16/4405 |
| 2004/0055708 A1 * | 3/2004 | Govindarajan | B08B 7/0035 |
| | | | 156/345.24 |
| 2006/0255260 A1 * | 11/2006 | Ludviksson | H01J 37/32954 |
| | | | 250/288 |
| 2009/0183684 A1 | 7/2009 | Radoiu | |
| 2010/0230053 A1 | 9/2010 | Nishio | |
| 2011/0204023 A1 | 8/2011 | Huh et al. | |
| 2012/0025710 A1 | 2/2012 | Klyuev et al. | |
| 2012/0261587 A1 | 10/2012 | Kellogg et al. | |
| 2012/0279657 A1 | 11/2012 | Srivastava et al. | |
| 2013/0082197 A1 | 4/2013 | Yang et al. | |
| 2013/0284724 A1 | 10/2013 | Cox et al. | |
| 2014/0262033 A1 | 9/2014 | Herbert et al. | |
| 2014/0291139 A1 | 10/2014 | Dickinson et al. | |
| 2014/0312761 A1 | 10/2014 | Tamagaki | |
| 2015/0187625 A1 | 7/2015 | Busche et al. | |
| 2015/0357168 A1 | 12/2015 | Dickinson | |
| 2017/0133208 A1 | 5/2017 | Cox et al. | |

* cited by examiner

VIRTUAL SENSOR FOR CHAMBER CLEANING ENDPOINT

CROSS-REFERENCE TO RELATED APPLICATIONS

This application claims benefit of U.S. Provisional Patent Application Ser. No. 62/432,055, filed Dec. 9, 2016, which is incorporated herein by reference in its entirety.

BACKGROUND

Field

Implementations of the present disclosure generally relate to methods for cleaning processing chambers. More specifically, implementations described herein relate to methods for determining processing chamber cleaning endpoints.

Description of the Related Art

Unwanted deposition of materials on the interior surfaces of processing chamber, such as the walls and chamber parts of plasma-enhanced chemical vapor deposition (PECVD) processing chambers, may occur during deposition processes. Such unwanted deposition may create particles and flakes within the processing chamber, resulting in the drift of process conditions and affecting process reproducibility and uniformity.

In order to achieve high processing chamber availability while reducing the cost of ownership for production and maintaining film quality, a chamber clean is performed to remove material residue from the interior surfaces of the processing chamber including the wall and process kits, e.g., showerhead, etc.

The clean time of the chamber clean is often a significant factor in semiconductor manufacturing processes and equipment productivity. Clean time generally refers to the amount of time to clean a piece of manufacturing equipment. Cleaning processes are often performed periodically to increase the useful life of manufacturing equipment. Cleaning processes also reduce the probability of manufacturing defective micro-devices because of sub-optimal processing environments within the manufacturing equipment. Accordingly, the clean time associated with equipment cleaning has a relatively large impact on particle reduction and throughput efficiency.

Insufficient clean time may cause the undesirable accumulation of reactant products and byproducts within the manufacturing equipment, which may result in increased device defectivity and process drift. Alternatively, excessive clean time can result in prolonged exposure to corrosive environments, which may result in premature degradation of the manufacturing equipment components. In addition, excessive clean time has a generally negative impact on throughput.

Current endpoint detection methods for determining clean time generally involve monitoring a secondary radical or plasma signal. Conventional methods for endpoint detection include, among others, the use of residual gas analysis (RGA), optical emission spectroscopy (OES), or non-dispersive infrared spectroscopy (NDIR). However, these methods may provide inaccurate endpoint determinations due to sub-optimal metrology conditions. For example, the lack of secondary plasma dissociation for RGA may result in inaccurate data for determining suitable endpoints. In another example, the lack of radicals/plasma at the detection location for OES may adversely affect the endpoint data. In addition, the instruments for performing the aforementioned analysis may be prohibitively expensive and may not be compatible on all types of equipment where it is desirable to perform endpoint detection.

Therefore, there is a need for improved methods for cleaning endpoint detection.

SUMMARY

Implementations of the present disclosure generally relate to methods for cleaning processing chambers. More specifically, implementations described herein relate to methods for determining processing chamber cleaning endpoints. In one implementation, a method of endpoint detection is provided. The method comprises performing a first plasma cleaning process in a clean chamber environment. The method further comprises determining a first chamber foreline pressure at two or more time intervals during the first plasma cleaning process. The method further comprises plotting a first trace defined by two or more time intervals, wherein the first trace defines the first chamber foreline pressure as a function of time. The method further comprises performing a second plasma cleaning process in an unclean chamber environment. The method further comprises determining a second chamber foreline pressure at two or more time intervals during the second cleaning process. The method further comprises determining a second trace defined by two or more time intervals, wherein the second trace defines the second chamber foreline pressure as a function of time. The method further comprises comparing the first trace and the second trace to determine a clean endpoint time.

In another implementation, a method of endpoint detection is provided. The method comprises performing a first plasma cleaning process in a clean chamber environment of a processing chamber, wherein the processing chamber is coupled with a vacuum pump via a vacuum foreline. The method further comprises determining a first chamber foreline pressure at two or more time intervals during the first plasma cleaning process by monitoring the pressure of exhaust gases in the vacuum foreline during the first plasma cleaning process. The method further comprises plotting a first trace defined by the two or more time intervals, wherein the first trace defines the first chamber foreline pressure as a function of time. The method further comprises performing a second plasma cleaning process in an unclean chamber environment of the processing chamber. The method further comprises determining a second chamber foreline pressure at two or more time intervals during the second plasma cleaning process by monitoring the pressure of the exhaust gases in the vacuum foreline during the second plasma cleaning process. The method further comprises determining a second trace defined by two or more time intervals, wherein the second trace defines the second chamber foreline pressure as a function of time. The method further comprises comparing the first trace and the second trace to determine a clean endpoint time.

In yet another implementation, a method of endpoint detection is provided. The method comprises performing a first plasma cleaning process in a clean chamber environment of a first processing chamber, wherein the first processing chamber is coupled with a first vacuum pump via a first vacuum foreline. The method further comprises determining a first chamber foreline pressure at two or more time intervals during the first plasma cleaning process by monitoring pressure of exhaust gases in the first vacuum foreline during the first plasma cleaning process. The method further comprises plotting a first trace defined by the two or more time intervals, wherein the first trace defines the first chamber foreline pressure as a function of time. The method further comprises performing a second plasma cleaning process in an unclean chamber environment of a second processing chamber, wherein the second processing chamber is coupled with a second vacuum pump via a second vacuum foreline. The method further comprises determining a second chamber foreline pressure at two or more time intervals during the second plasma cleaning process by monitoring pressure of exhaust gases in the second vacuum foreline during the second plasma cleaning process. The method further comprises determining a second trace defined by two or more time intervals, wherein the second trace defines the second chamber foreline pressure as a function of time. The method further comprises comparing the first trace and the second trace to determine a clean endpoint time.

BRIEF DESCRIPTION OF THE DRAWINGS

So that the manner in which the above-recited features of the present disclosure can be understood in detail, a more particular description of the implementations, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

Figure 1:
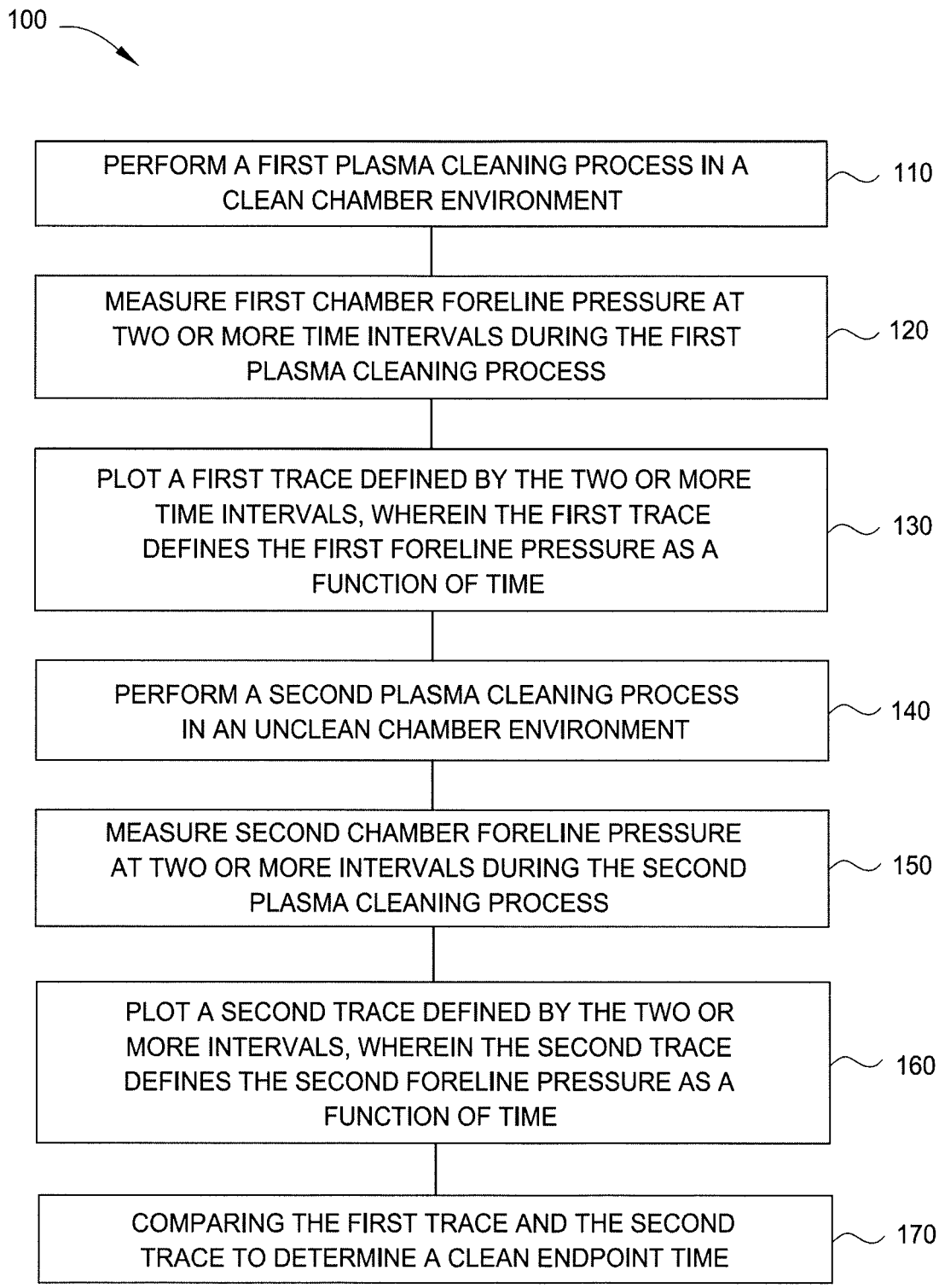
FIG. 1 illustrates operations of a method for determining a cleaning process endpoint in accordance with one or more implementations described herein.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

The following disclosure describes techniques for determining cleaning endpoints in a substrate-processing chamber. Certain details are set forth in the following description and in FIGS. 1-6 to provide a thorough understanding of various implementations of the disclosure. Other details describing well-known structures and systems often associated with deposition systems, plasma-processing systems and cleaning methods are not set forth in the following disclosure to avoid unnecessarily obscuring the description of the various implementations.

Many of the details, dimensions, angles and other features shown in the Figures are merely illustrative of particular implementations. Accordingly, other implementations can have other details, components, dimensions, angles and features without departing from the spirit or scope of the present disclosure. In addition, further implementations of the disclosure can be practiced without several of the details described below.

Implementations described herein will be described below in reference to a plasma cleaning process that can be carried out using any suitable thin film deposition system. Examples of suitable systems include the CENTURA® systems which may use a DXZ® processing chamber, PRECISION 5000® systems, PRODUCER® systems, PRODUCER® GT™ systems, and PRODUCER® SE™ systems which are commercially available from Applied Materials, Inc., of Santa Clara, Calif. Other tools capable of performing cleaning endpoint detection processes may also be adapted to benefit from the implementations described herein. In addition, any system enabling the cleaning endpoint detection processes described herein can be used to advantage. The apparatus description described herein is illustrative and should not be construed or interpreted as limiting the scope of the implementations described herein.

Implementations of the present disclosure generally relate to methods for cleaning processing chambers. More specifically, implementations described herein relate to methods for determining processing chamber cleaning endpoints. In some implementations, a "virtual sensor" for detecting a cleaning endpoint is provided. The "virtual sensor" is based on monitoring trends of chamber foreline pressure during cleaning of the chamber, which involves converting solid deposited films on the chamber parts into gaseous byproducts by reaction with etchants like fluorine plasma for example. Validity of the "virtual sensor" has been confirmed by comparing the "virtual sensor" response with infrared-based optical measurements. In another implementation, methods of accounting for foreline pressure differences due to facility design and foreline clogging over time.

In one implementation, a method for detecting a cleaning endpoint is provided. The method includes performing a cleaning process in a processing chamber in a cleaned state (e.g., with no deposited film) and obtaining a trace of foreline pressure versus time. Then the clean process is performed with intended CVD film or films deposited in the processing chamber and a second trace of foreline pressure versus time is obtained. Where the first trace and the second trace meet, the cleaned chamber state and the cleaning endpoint is identified. The shaded area between the two curves is proportional to amount of film deposited in the processing chamber and has been shown to be linear to film thickness deposited in the processing chamber.

In another implementation, methods of monitoring cleaning process repeatability are provided. The method of monitoring cleaning process repeatability includes tracking the foreline area versus time over a period of time and across multiple chambers during a cleaning process. Foreline pressure variation due to, for example, build-up in the foreline over time and/or different rough pump to pump to chamber line length and diameter can be a source of chamber-to-chamber difference. The method of monitoring cleaning process repeatability relies on the fact that changes in foreline pressure during cleaning processes are related to foreline pressure monitored at the end of the cleaning process (or another point where there is an inert or no gas flowing through the chamber). The method of cleaning process repeatability can be used to predict the foreline pressure response across multiple chambers and/or for a chamber over time.

FIG. 1 illustrates operations of a method 100 for determining a cleaning process endpoint in accordance with one or more implementations described herein. At operation 110, a first plasma cleaning process is performed in a clean chamber environment. A clean chamber environment, as described herein, is a chamber environment, which is substantially free or free of material deposition on various components within a processing volume of the chamber. The plasma cleaning process may utilize plasma generated in-situ or the plasma may be generated ex-situ (e.g., remotely). Suitable plasma generation techniques, such as inductive coupling, capacitive coupling, or thermal plasma generation techniques may be utilized to form the cleaning plasma.

Various cleaning chemistries may be utilized to form the cleaning plasma. Suitable precursor materials for forming a cleaning plasma include fluorine-containing chemistry, chlorine-containing chemistry, oxygen-containing chemistry and the like. It is contemplated that the cleaning plasma chemistry may be selected to be reactive with materials deposited in the chamber environment. In one implementation, fluorine radicals (e.g., formed from $NF_3$) are utilized during the first plasma cleaning process. Operation 110 is generally performed to define a baseline reference for subsequent comparison of a plasma cleaning process, such as the plasma cleaning process of operation 140.

Figure 2:
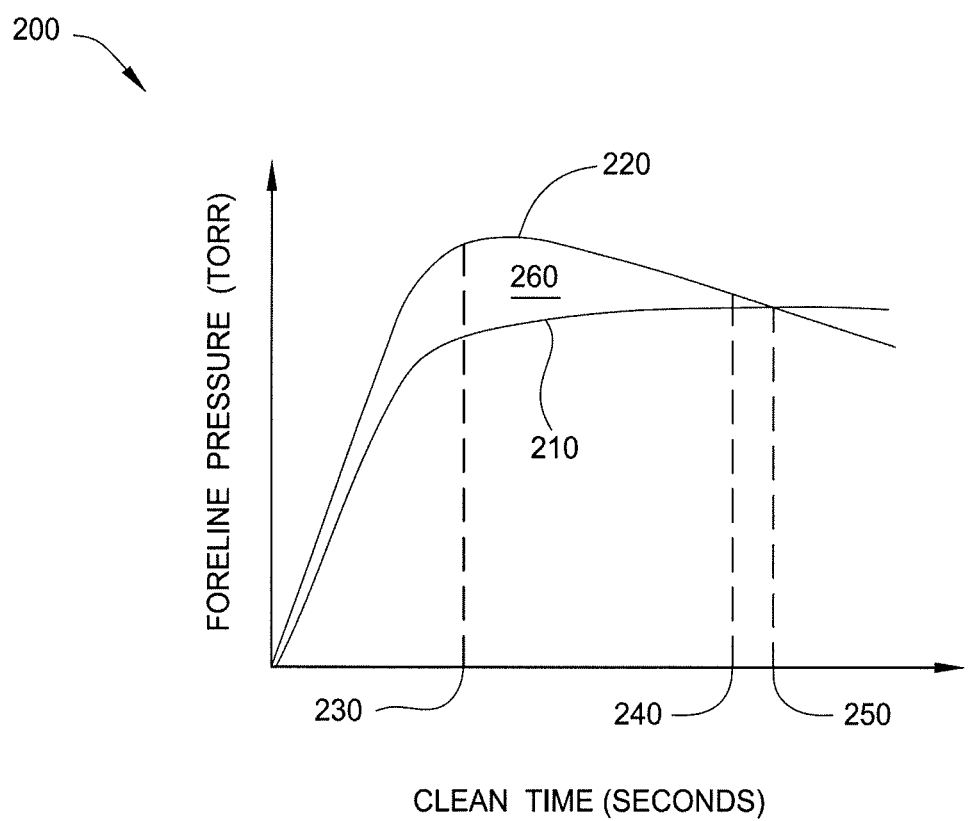
FIG. 2 illustrates a graph depicting chamber foreline pressure as a function of cleaning time for a cleaning process performed in a clean chamber environment and an unclean chamber environment in accordance with one or more implementations of the present disclosure.

FIG. 2 illustrates a graph 200 depicting chamber foreline pressure as a function of cleaning time for a cleaning process performed in a clean chamber environment and an unclean chamber environment in accordance with one or more implementations of the present disclosure. A first trace 210 is representative of the chamber foreline pressure as a function of time in a clean chamber environment and a second trace 220 is representative of the chamber foreline pressure as a function of time in an unclean chamber environment. As illustrated, a slope of the second trace 220 initially increases slightly over time and it is believed that this increase may be due to an increase in gaseous by-products formed during the cleaning process by converting solid films in the unclean chamber environment to gaseous by-products, which increases the pressure in the chamber foreline.

Referring back to FIG. 1, the method 100 continues at operation 120 by determining chamber foreline pressure at two or more time intervals 230, 240 (See FIG. 2) during the first plasma cleaning process. Although two time intervals are described, it is contemplated that more time intervals may be selected to monitor the change in foreline pressure over time. The rate of change of foreline pressure refers to the change in foreline pressure within a specific amount of time, for example, Torr/second. As illustrated in FIG. 2, the foreline pressure rates are determined at a first time interval 230 and a second time interval 240. In one implementation, a first foreline pressure rate may correspond to the first time interval 230 and a second foreline pressure rate may correspond to the second time interval 240.

At operation 130, the first trace 210 defined by the two or more time intervals 230, 240 is plotted. In one implementation, she first trace 210 is determined by plotting the change in chamber foreline pressure over time. Accordingly, the first trace 210 generally defines the foreline pressure rate of the clean chamber environment as a function of time.

At operation 140, a second plasma cleaning process is performed in an unclean chamber environment. The unclean chamber environment is different from the clean chamber environment in that material deposits exist on various components within the unclean chamber environment. In one implementation, the second plasma cleaning process is similar to the first plasma cleaning process. Accordingly, the same or similar chemistries and processing conditions may be utilized in both the first and second plasma-cleaning processes.

At operation 150, the chamber foreline pressure is determined at two or more time intervals 230, 240 during the second plasma cleaning process. The second trace 220 is representative of the chamber foreline pressure as a function of time in an unclean chamber environment. Generally, the time intervals utilized during operation 120 are the same time intervals utilized during operation 150. Similar to the first foreline pressure rates, the second foreline pressure rate refers to the change in foreline pressure within a specific amount of time, for example, Torr/second. As described above, the second foreline pressure rates may be determined at the first time interval 230 and the second time interval 240.

At operation 160, the second trace 220 defined by the two or more time intervals 230, 240 is plotted. Similar to determination of the first trace 210 in operation 130, the second trace 220 is determined by plotting the change in chamber foreline pressure over time during the second plasma cleaning process. Accordingly, the second trace 220 generally defines the second foreline pressure of the unclean chamber environment as a function of time.

It should be noted that the delta 260 between the first trace 210 and the second trace 220 is believed to be caused by an increase in gaseous by-products due to the conversion of contaminant films to gases during the second plasma cleaning process.

At operation 170, the first trace 210 and the second trace 220 are compared to determine a clean endpoint time 250. A clean endpoint time is represented by the time when the first trace 210 and the second trace 220 intersect.

Optionally, after determining the clean time endpoint, an amount of additional cleaning time may be added to the clean time endpoint to ensure complete cleaning. In one implementation, the additional amount of cleaning time is less than about 5% of the total clean time (e.g., between about 1% to about 5% of the total clean time).

In some implementations, a chamber clean is performed using the cleaning endpoint time determined in operation 170. For example, in some implementations, a third plasma cleaning process is performed in an unclean chamber environment, wherein the third plasma cleaning process ends at the clean endpoint time. The third plasma cleaning process may be performed in the same processing chamber as the first plasma cleaning process and/or the second plasma cleaning process.

Figure 3:
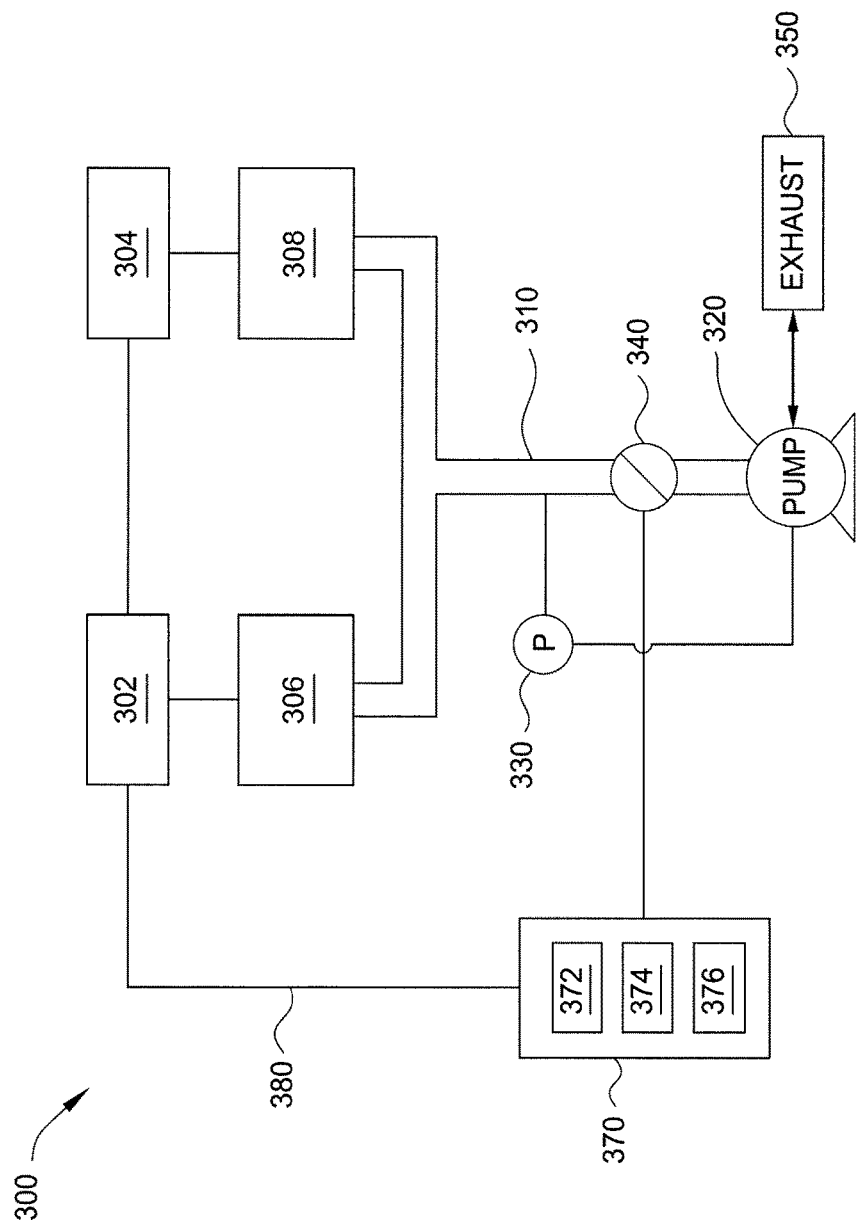
FIG. 3 is a schematic illustration of a processing system in which implementations of the present disclosure may be practiced.

FIG. 3 schematically illustrates a processing system 300 in which implementations of the method 100 and the method 400 may be implemented. It is contemplated that the method 100 described herein provides for advantageous in-situ clean end point determination without utilizing external equipment associated with conventional endpoint detection processes. The processing system 300 includes a first remote plasma source 302 and a second remote plasma source 304 which are respectively coupled to a first processing chamber 306 and a second processing chamber 308. The first processing chamber 306 and the second processing chamber 308 are generally exhausted via a vacuum foreline 310 fluidly coupled with an exhaust 350 after performing cleaning processes. The first processing chamber 306 and the second processing chamber 308 are fluidly coupled with a vacuum pump 320 via the vacuum foreline 310. A pressure sensor 330 is positioned along the vacuum foreline 310 for measuring pressure of the exhaust gases in the vacuum foreline 310. In one implementation, a chamber foreline valve 340 is placed at a section of the vacuum foreline 310 downstream of where the vacuum foreline 310 connects to the first and second processing chambers 306, 308 and upstream of where the vacuum foreline 310 and the vacuum pump 320 meet. The chamber foreline valve 340 is able to control the amount of fluid communication between the first processing chamber 306 and the second processing chamber 308. In one implementation, the chamber foreline valve 340 is a throttle valve that is configured to control the gas flow rate in the vacuum foreline 310 and/or pressure within the first processing chamber 306 and the second processing chamber 308.

The processing system 300 further includes a controller 370. The controller 370 includes a central processing unit (CPU) 372, a memory 374, and a support circuit 376 utilized to control the process sequence and regulate gas flows. The CPU 372 may be of any form of a general-purpose computer processor used in an industrial setting. The software routines can be stored in the memory 374, such as random access memory, read only memory, floppy, or hard disk drive, or other form of digital storage. The support circuit 376 is conventionally coupled to the CPU 372 and may include cache, clock circuits, input/output systems, power supplies, and the like. Bi-directional communications between the controller 370 and the various components of the processing system 300 are handled through numerous signal cables collectively referred to as signal buses 380, some of which are illustrated in FIG. 3. Although processing system 300 depicts two processing chambers, it should be understood that the methods described herein may be practiced on processing systems including any number of processing chambers. For example, in one implementation, the methods described herein are practiced on a processing system including a single processing chamber coupled with a vacuum pump via a foreline.

Figure 4:
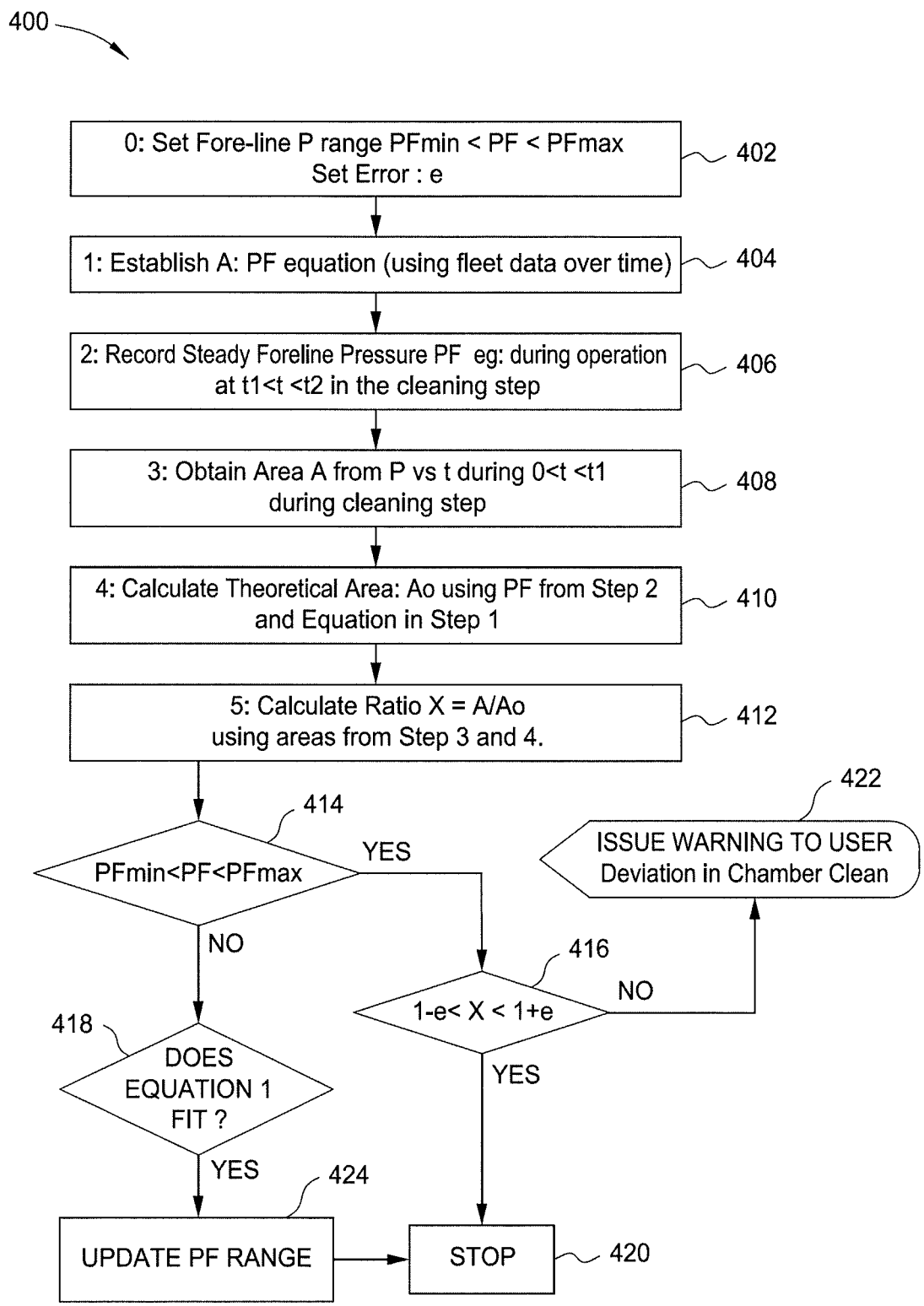
FIG. 4 illustrates operations of a method for determining repeatability of a cleaning process in accordance with one or more implementations described herein.
Figure 5:
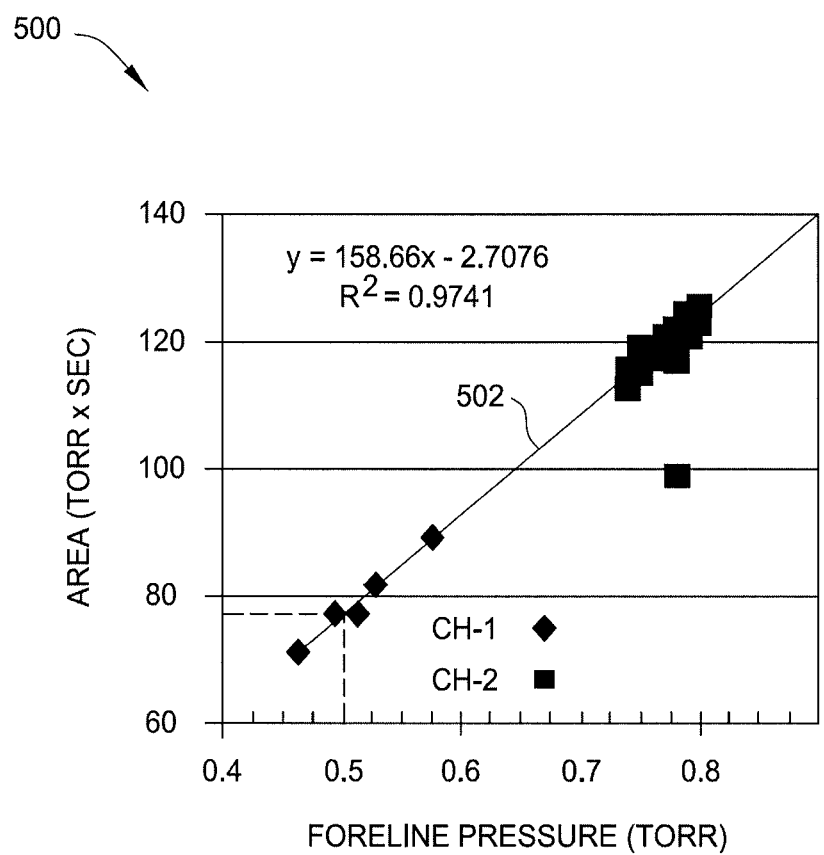
FIG. 5 illustrates a graph depicting area as a function of foreline pressure in accordance with one or more implementations of the present disclosure.
Figure 6:
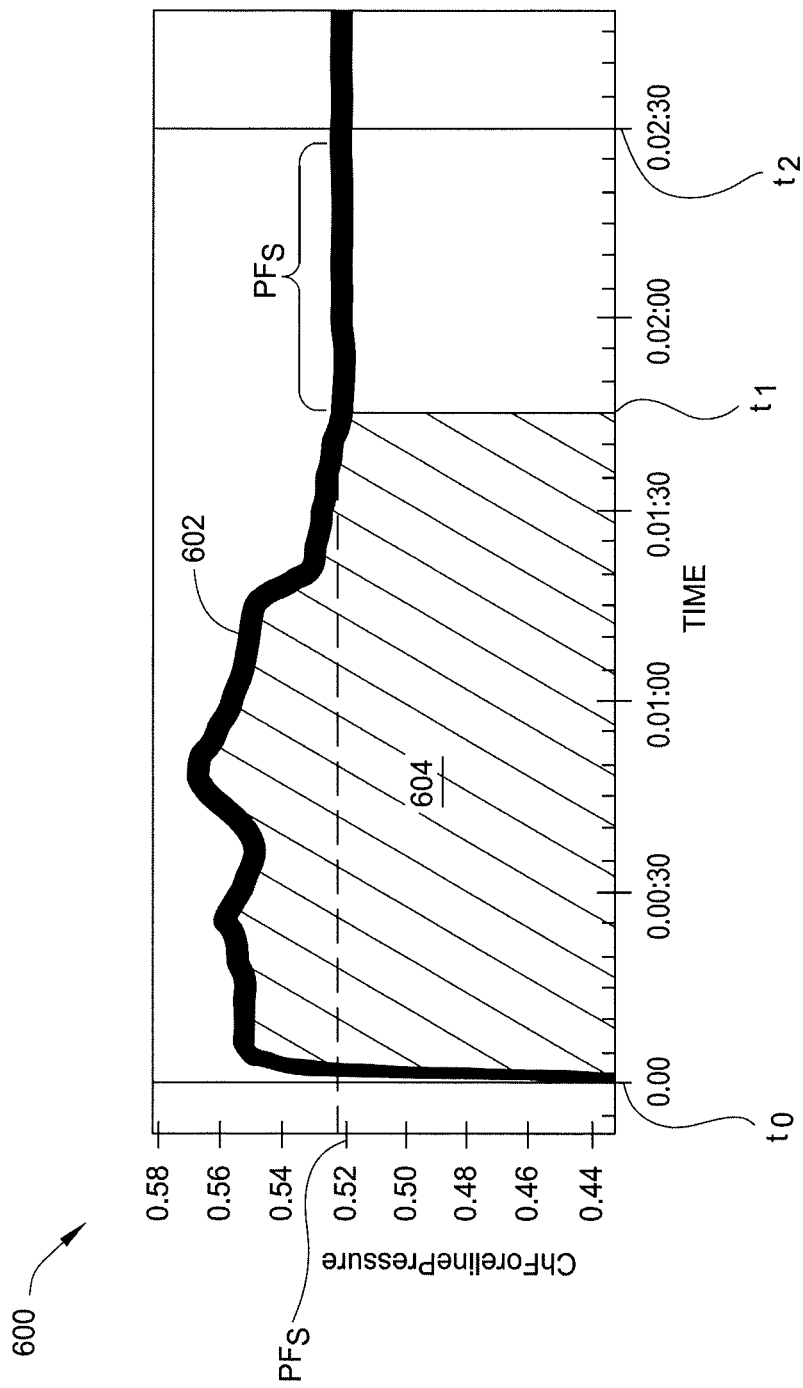
FIG. 6 illustrates a graph depicting chamber foreline pressure as a function of cleaning time in accordance with one or more implementations of the present disclosure.

FIG. 4 illustrates operations of a method 400 for determining repeatability of a cleaning process in accordance with one or more implementations described herein. The method 400 of determining cleaning process repeatability includes tracking the foreline area as a function of time over a period of time and across multiple chambers during a cleaning process. The method 400 of monitoring cleaning process repeatability relies on the fact that changes in foreline pressure during cleaning processes are related to the foreline pressure monitored at the end of the cleaning process (or another point during the cleaning process where there is an inert or no gas flowing through the chamber). FIG. 5 illustrates a graph 500 depicting area as a function of foreline pressure in accordance with one or more implementations of the present disclosure. FIG. 6 illustrates a graph 600 depicting chamber foreline pressure as a function of cleaning time in accordance with one or more implementations of the present disclosure. FIGS. 4-6 will be discussed in conjunction. FIGS. 5 and 6 will be used to explain the method 400 depicted in the flow chart of FIG. 4.

FIG. 5 illustrates a graph 500 depicting area as a function of foreline pressure in accordance with one or more implementations of the present disclosure. Graph 500 depicts area (Torr×sec) on the y-axis as a function of foreline pressure (Torr) on the x-axis. Trace 502 represents a foreline pressure or "PF" calibration curve. In some implementations, trace 502 is determined empirically using fleet data. The fleet data may be obtained by cleaning one or more processing chambers and monitoring the change in foreline pressure over time for each chamber and cleaning process. For example, as shown in FIG. 5, fleet data was obtained from cleaning processes performed on a first chamber "CH-1" and cleaning processes performed on a second chamber "CH-2." For each cleaning process run, the change in foreline pressure is plotted as a function of time, similarly to the curve 602 depicted in graph 600. The steady-state pressure (PFs) for each cleaning run is determined as discussed below and the area "A" under the curve is determined. Using the data from each cleaning run, the area "A" is plotted as a function of PFs. Trace 502 represents a line of best fit for the data plotted from each cleaning run.

FIG. 6 illustrates a graph 600 depicting chamber foreline pressure as a function of cleaning time for a chamber cleaning process in accordance with one or more implementations of the present disclosure. Graph 600 depicts chamber foreline pressure (Torr) on the y-axis as a function of time (seconds) on the x-axis. The first trace may be determined by plotting the change in chamber foreline pressure over time during the chamber cleaning process. In one implementation, the chamber cleaning process is performed in an unclean chamber environment similar to the process of operation 140. Accordingly, curve 602 generally defines the foreline pressure as a function of time during the chamber cleaning process. Time "$t_0$" represents the beginning of the chamber cleaning process. Time "$t_1$" represents the time when the foreline pressure stabilizes to the steady foreline pressure (PFs) depicted between "$t_1$" and "$t_2$". Time "$t_2$" represents the end of the chamber cleaning process.

Referring back to FIG. 4, at operation 402, a selected foreline pressure range, PFmin<PF<PFmax, is set. The selected foreline pressure range includes a minimum foreline pressure range (PFmin) and a maximum foreline pressure range (PFmax). In one implementation, the selected foreline pressure range is set by the user. The selected foreline pressure range of operation 402 may be selected based on several factors. For example, in some implementations, the selected foreline pressure range is selected based on the foreline pressure range used to obtain the data on which the calibration curve (e.g., trace 502) is based. In some implementations, the foreline pressure range may be selected based on previous data of the foreline pressure for a given tool, gas load, and fabrication facility layout. For example, in one exemplary process as shown in FIG. 5, PFmin is defined as about 0.4 Torr and PFmax is defined as about 1 Torr.

During operation 402, an error value ("e") is established. In one implementation, the error value "e" is based on the difference between the actual foreline pressure and selected foreline pressure from previous cleaning runs. In one implementation, the error value "e" is based on previous error values "e" from previous data of the foreline pressure for a given tool, gas load, and/or fabrication facility layout. In one implementation, the error value "e" is defined by the user. In some implementations, the error value "e" is based on the $R^2$ or residual of the calibration curve (e.g., trace 502). In one exemplary process, the error value "e" was selected to be 0.02.

At operation 404, a foreline pressure "PF" equation as depicted in FIG. 5 is established using fleet data over time. In one implementation, the fleet data is determined by tracking the foreline area versus time over a period of time and across multiple chambers during cleaning processes as discussed above. Referring to FIG. 5, the "PF" equation is depicted in graph 500. The foreline pressure on the x-axis is defined by PFmin (e.g., 0.4 Torr) and PFmax (e.g., 1 Torr) as defined during operation 402.

At operation 406, the steady foreline pressure ($PF_s$) is determined from graph 600 depicted in FIG. 6. Referring to FIG. 6, $PF_s$ is typically determined by locating the point "t1" along curve 602 where the slope of the curve 602 approaches zero. For example, as depicted in graph 600 the flat portion of curve 602 between "$t_1$" and "$t_2$" represents stabilized or steady foreline pressure $PF_s$. The flat portion of curve 602 is extrapolated to the y-axis to determine PFs. For example, in graph 600, PFs is about 0.52 Torr.

At operation 408, an area "A" is obtained from chamber foreline pressure ("P") versus time (t) during $0<t<t_1$ from the cleaning process depicted in the graph 600 of FIG. 6. The area is represented by the shaded region 604. The area is determined by calculating the area of the shaded region 604 defined by "$t_0$" to "$t_1$" and the curve 602.

At operation 410, the theoretical area ("$A_o$") is determined by using $PF_s$ determined in operation 406 and trace 502. PFs is located on the x-axis of graph 500 and the theoretical area ("$A_o$") is found on the y-axis using trace 502. For example, using a PFs of about 0.52 as determined in operation 406, the theoretical area $A_0$ is about 77 Torr× seconds.

At operation 412, the ratio "X" is determined by calculating the ratio of the actual area "A" determined in operation 408 with the theoretical area "$A_o$" determined during operation 410.

At operation 414, it is determined whether PFs determined during operation 406 falls within the pressure range defined in operation 402. If PFs falls within the defined pressure range (PFmin<PF<PFmax) the process proceeds to operation 416. For example, the PFs of 0.52 falls within the defined range of PFmin of 0.4 Torr and PFmax of 1 Torr.

At operation 416, it is determined whether ratio X falls within the range of the user defined error values from operation 402. If ratio X falls within the range defined by the user defined error values, the process ends at operation 420. If ratio X does not fall within the range defined by the user-defined error values, a warning is issued at operation 422 that the chamber clean is not within specification. In response to the issued warning, the user may do one of the following: compare the traces and investigate if there is impact on (1) any film properties including but not limited to particle performance; (2) if the Remote Plasma unit for cleaning is properly functioning; (3) if the proper film was deposited before cleaning; and/or (4) whether any thermal boundary conditions have changed. In one implementation, a chamber clean is performed based on the updated results of operation 422.

If ratio PFs does not fall within the defined pressure range, the process proceeds to operation 418. During operation 418, the equation established during operation 404 is checked for validity outside of the PFmin, PFmax range. The validity is checked by checking if A/Ao=X is still within the error limits imposed. If A/Ao=X is within the imposed error limits, the additional data point may be used to extend the validity of PF range. The PFmin and/or PFmax defined during operation 402 may be expanded or updated at operation 424 as appropriate for future use. A chamber may be cleaned using the updated PFmin and/or PFmax.

In summary, some of the benefits of some implementations of the present disclosure provide a process of monitoring a cleaning endpoint, which provides a more accurate detection of clean endpoint, improved chamber cleaning and reduced chamber downtime. Some implementations described herein overcome several of the challenges and limitations of throttle valve angle to detect clean endpoint and use of chamber pressure to detect clean endpoint. Further, some implementations described herein improve reliability and costs relative to currently available optical sensors.

Implementations of the disclosure and all of the functional operations described in this specification can be implemented in digital electronic circuitry, or in computer software, firmware, or hardware, including the structural means disclosed in this specification and structural equivalents thereof, or in combinations of them. Implementations of the disclosure can be implemented as one or more computer program products, i.e., one or more computer programs tangibly embodied in a machine-readable storage media, for execution by, or to control the operation of, data processing apparatus, e.g., a programmable processor, a computer, or multiple processors or computers. A computer program (also known as a program, software, software application, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file. A program can be stored in a portion of a file that holds other programs or data, in a single file dedicated to the program in question, or in multiple coordinated files (e.g., files that store one or more modules, sub-programs, or portions of code). A computer program can be deployed to be executed on one computer or on multiple computers at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can be implemented as, special purpose logic circuitry, e.g., an FPGA (field programmable gate array) or an ASIC (application-specific integrated circuit).

When introducing elements of the present disclosure or exemplary aspects or implementation(s) thereof, the articles "a," "an," "the" and "said" are intended to mean that there are one or more of the elements.

The terms "comprising," "including" and "having" are intended to be inclusive and mean that there may be additional elements other than the listed elements.

While the foregoing is directed to implementations of the present disclosure, other and further implementations of the disclosure may be devised without departing from the basic scope thereof, and the scope thereof is determined by the claims that follow.

The invention claimed is:

1. A method of endpoint detection, comprising:
performing a first plasma cleaning process in a clean chamber environment;
determining a first chamber foreline pressure at two or more time intervals during the first plasma cleaning process;
plotting a first trace defined by the two or more time intervals for the first plasma cleaning process, wherein the first trace defines the first chamber foreline pressure as a function of time;
performing a second plasma cleaning process in an unclean chamber environment;

determining a second chamber foreline pressure at two or more time intervals during the second plasma cleaning process;

determining a second trace defined by the two or more time intervals for the second plasma cleaning process, wherein the second trace defines the second chamber foreline pressure as a function of time; and comparing the first trace and the second trace to determine a clean endpoint time.

2. The method of claim 1, further comprising cleaning a processing chamber using the clean endpoint time.

3. The method of claim 1, wherein the first plasma cleaning process defines a baseline reference.

4. The method of claim 1, wherein the clean chamber environment is substantially devoid of material deposits.

5. The method of claim 1, wherein the first plasma cleaning process and the second plasma cleaning process utilize a fluorine-containing chemistry, a chlorine-containing chemistry, an oxygen-containing chemistry, or combinations thereof.

6. The method of claim 1, wherein the first plasma cleaning process and the second plasma cleaning process are remote plasma cleans.

7. The method of claim 1, wherein the two or more time intervals for the first plasma cleaning process and the two or more time intervals for the second plasma cleaning process are the same.

8. The method of claim 1, wherein the clean endpoint time occurs when the first trace and the second trace are substantially equal.

9. The method of claim 1, further comprising:
adding an amount of clean time less than about 5% of a total clean time to the clean endpoint time after determining the clean endpoint time.

10. A method of endpoint detection, comprising:
performing a first plasma cleaning process in a clean chamber environment of a processing chamber, wherein the processing chamber is coupled with a vacuum pump via a vacuum foreline;
determining a first chamber foreline pressure at two or more time intervals during the first plasma cleaning process by monitoring a pressure of exhaust gases in the vacuum foreline during the first plasma cleaning process;
plotting a first trace defined by the two or more time intervals for the first plasma cleaning process, wherein the first trace defines the first chamber foreline pressure as a function of time;
performing a second plasma cleaning process in an unclean chamber environment of the processing chamber;
determining a second chamber foreline pressure at two or more time intervals during the second plasma cleaning process by monitoring a pressure of exhaust gases in the vacuum foreline during the second plasma cleaning process;
determining a second trace defined by the two or more time intervals for the second plasma cleaning process, wherein the second trace defines the second chamber foreline pressure as a function of time; and
comparing the first trace and the second trace to determine a clean endpoint time.

11. The method of claim 10, further comprising performing a third plasma cleaning process in an unclean chamber environment, wherein the third plasma cleaning process ends at the clean endpoint time.

12. The method of claim 10, wherein the pressure of exhaust gases is monitored via a pressure sensor coupled with the vacuum foreline.

13. The method of claim 10, wherein the clean chamber environment is substantially devoid of material deposits.

14. The method of claim 10, wherein the first plasma cleaning process and the second plasma cleaning process utilize a fluorine-containing chemistry, a chlorine-containing chemistry, an oxygen-containing chemistry, or combinations thereof.

15. The method of claim 10, wherein the first plasma cleaning process and the second plasma cleaning process are remote plasma cleans.

16. The method of claim 10, wherein the two or more time intervals for the first plasma cleaning process and the two or more time intervals for the second plasma cleaning process are the same.

17. The method of claim 10, wherein the clean endpoint time occurs when the first trace and the second trace are substantially equal.

18. The method of claim 10, further comprising:
adding an amount of clean time less than about 5% of a total clean time to the clean endpoint time after determining the clean endpoint time.

19. A method of endpoint detection, comprising:
performing a first plasma cleaning process in a clean chamber environment of a first processing chamber, wherein the first processing chamber is coupled with a first vacuum pump via a first vacuum foreline;
determining a first chamber foreline pressure at two or more time intervals during the first plasma cleaning process by monitoring a pressure of exhaust gases in the first vacuum foreline during the first plasma cleaning process;
plotting a first trace defined by the two or more time intervals for the first plasma cleaning process, wherein the first trace defines the first chamber foreline pressure as a function of time;
performing a second plasma cleaning process in an unclean chamber environment of a second processing chamber, wherein the second processing chamber is coupled with a second vacuum pump via a second vacuum foreline;
determining a second chamber foreline pressure at two or more time intervals during the second plasma cleaning process by monitoring a pressure of exhaust gases in the second vacuum foreline during the second plasma cleaning process;
determining a second trace defined by the two or more time intervals for the second plasma cleaning process, wherein the second trace defines the second chamber foreline pressure as a function of time; and
comparing the first trace and the second trace to determine a clean endpoint time.

20. The method of claim 19, further comprising performing a third plasma cleaning process in an unclean chamber environment, wherein the third plasma cleaning process ends at the clean endpoint time.

* * * * *